US009478566B2

(12) United States Patent
Liu

(10) Patent No.: US 9,478,566 B2
(45) Date of Patent: Oct. 25, 2016

(54) ARRAY SUBSTRATE, LCD DEVICE AND DRIVING METHOD

(71) Applicant: BOE TECHNOLOGY GROUP CO., LTD., Beijing (CN)

(72) Inventor: Yaohu Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 290 days.

(21) Appl. No.: 14/059,883

(22) Filed: Oct. 22, 2013

(65) Prior Publication Data
US 2014/0111099 A1  Apr. 24, 2014

(30) Foreign Application Priority Data

Oct. 22, 2012  (CN) .......................... 2012 1 0405075

(51) Int. Cl.
H05B 37/00 (2006.01)
H01L 27/12 (2006.01)
G02F 1/1343 (2006.01)
G09G 3/36 (2006.01)
G02F 1/1362 (2006.01)
H05B 37/02 (2006.01)

(52) U.S. Cl.
CPC ....... *H01L 27/1255* (2013.01); *G02F 1/13624* (2013.01); *G02F 1/134363* (2013.01); *G09G 3/3659* (2013.01); *H05B 37/02* (2013.01); *G09G 2300/0847* (2013.01); *G09G 2320/0247* (2013.01); *H01L 27/1251* (2013.01)

(58) Field of Classification Search
USPC .................................................. 315/160–176
See application file for complete search history.

(56) References Cited

U.S. PATENT DOCUMENTS

| 2007/0024775 | A1* | 2/2007 | Lee ...................... G02F 1/13394 349/110 |
| 2007/0080370 | A1 | 4/2007 | Miyachi et al. |
| 2008/0018843 | A1* | 1/2008 | Park ...................... G02F 1/1339 349/139 |
| 2010/0053484 | A1* | 3/2010 | Ono .................. G02F 1/134363 349/37 |

(Continued)

FOREIGN PATENT DOCUMENTS

| CN | 101364395 A | 2/2009 |
| CN | 101852953 A | 10/2010 |

(Continued)

OTHER PUBLICATIONS

Notice of Final Rejection issued in Korean application No. 10-2013-0125774 dated Aug. 31, 2015.

(Continued)

Primary Examiner — Brandon S Cole
(74) Attorney, Agent, or Firm — Nath, Goldberg & Meyer; Jerald L. Meyer

(57) ABSTRACT

In an embodiments of the present invention, since two pixel electrodes are arranged in the pixel unit and each of the pixel electrodes is respectively controlled by a corresponding TFT, the rotation direction of the liquid crystal molecules may be controlled by the voltage difference between the two pixel electrodes, while the voltage on the pixel electrodes of other pixel units in the array substrate is not affected, so that the greenish phenomenon can be avoided. Furthermore, since the two TFTs for controlling the two pixel electrodes respectively may have same parasitic capacitor when the pixel unit is turned off, the voltage difference between the two pixel electrodes is kept unchanged, and thus the occurrence of the image flickering can be avoided.

19 Claims, 5 Drawing Sheets

(56) References Cited

U.S. PATENT DOCUMENTS

| | | | |
|---|---|---|---|
| 2010/0103085 A1 | 4/2010 | Lee et al. | |
| 2010/0201932 A1* | 8/2010 | Gotoh | G02F 1/13458 349/141 |
| 2010/0245700 A1 | 9/2010 | Zhao et al. | |
| 2011/0006974 A1* | 1/2011 | Kim | G02F 1/136213 345/90 |
| 2012/0154724 A1* | 6/2012 | Yang | G02F 1/134309 349/108 |
| 2013/0335393 A1* | 12/2013 | Wang | H04N 13/0429 345/212 |
| 2014/0036187 A1* | 2/2014 | Miyata | G09G 3/3659 349/41 |

FOREIGN PATENT DOCUMENTS

| | | |
|---|---|---|
| JP | 2006292854 A | 10/2006 |
| JP | 2007101972 A | 4/2007 |
| KR | 20020077008 A | 10/2002 |
| KR | 20020089977 A | 11/2002 |
| KR | 1020020089977 A | 11/2002 |
| KR | 1020040062113 A | 7/2004 |
| KR | 1020060072774 A | 6/2006 |
| KR | 1020060077883 A | 7/2006 |

OTHER PUBLICATIONS

European Search Report dated Feb. 7, 2014 in reference to application No. 13189737.3-1904.
Chinese First Office Action dated Aug. 25, 2015 corresponding to application No. 2012104050759.
Korean First Office Action dated Sep. 29, 2014 corresponding to application No. 1020130125774.
Korean Second Office Action dated Mar. 29, 2015 corresponding to application No. 1020130125774.

* cited by examiner

ARRAY SUBSTRATE, LCD DEVICE AND DRIVING METHOD

CROSS REFERENCE OF THE RELATED APPLICATIONS

The present application claims priority to and incorporates by reference the entire contents of Chinese priority document 201210405075.9, filed in China on Oct. 22, 2012.

BACKGROUND OF THE INVENTION

1. Field of the Invention

The present invention relates to the technical field of liquid crystal display (LCD), and more particularly to an array substrate, an LCD device and a driving method.

2. Description of the Prior Art

So far the driving for each pixel unit in an array substrate of an LCD device may be achieved by: a voltage is applied on a pixel electrode which covers the pixel unit, so that an electric field is generated between a pixel electrode and a common electrode, and thus liquid crystal molecules in the pixel rotate for a certain angle, so as to transmit or block off lights.

The common electrode is configured for supplying a uniform common voltage $V_{-com}$ to all pixel units; the pixel electrode is configured for supplying a pixel voltage $V_{-pixel}$ to a corresponding pixel unit; and the voltage is configured for controlling an amount of light that transmits the pixel unit. When a frame of image is required to be displayed by the LCD device, a mode of line scanning (i.e. pixel units are turned on line by line, and the pixel units in a current line are turned off when the pixel units in a next line are about to be turned on) is usually applied. The pixel voltage is applied on the pixel electrodes when the pixel units are turned on, so that the display of the image is implemented.

During the process of implementing the display of the image by the electrical field between the pixel voltage and the uniform common voltage, if the pixel voltages of two pixel units in neighboring lines of a same column are different, the pixel electrode of the pixel unit that is turned on later is coupled to the common electrode, which may lead to the variation of the common voltage on the common electrode. As a result, the electrical field between the pixel electrode of the pixel unit that is turned on earlier and the common electrode varies, which results in a greenish phenomenon.

Furthermore, the pixel electrode is generally coupled to a drain electrode of a thin film transistor (TFT) in the corresponding pixel unit. The TFT is also turned off when the pixel unit is turned off. When the TFT is turned off, the pixel voltage on the pixel electrode gradually decreases as time elapses because of a leakage current and a parasitic capacitor, so that the voltage difference between the pixel electrode and the common electrode varies, which results in a flicker phenomenon.

SUMMARY OF THE INVENTION

Embodiments of the present invention provide a pixel unit, an array substrate, an LCD panel, an LCD device and a driving method for solving the problem of greenish phenomenon and image flickering phenomenon which appear when a conventional LCD device displays an image.

For achieving the above object, an embodiment of the present invention provides the following technical solution:

A pixel unit may comprise a first thin film transistor (TFT), a second TFT, a first pixel electrode and a second pixel electrode. The drain electrode of the first TFT may be electrically coupled to the first pixel electrode. The drain electrode of the second TFT may be electrically coupled to the second pixel electrode. And the first pixel electrode may be electrically insulated from the second pixel electrode, so that when a voltage difference exists between the first pixel electrode and the second pixel electrode, an electrical field is generated between the first pixel electrode and the second pixel electrode.

Preferably, the pixel unit may further comprise two gate lines and one data line. The gate electrode of the first TFT may be electrically coupled to a first gate line of the two gate lines. The gate electrode of the second TFT may be electrically coupled to a second gate line of the two gate lines. The source electrodes of the first and second TFTs may be electrically coupled to the data line.

Preferably, the pixel unit may further comprise two gate lines and two data lines. The gate electrode of the first TFT may be electrically coupled to a first gate line of the two gate lines. The gate electrode of the second TFT may be electrically coupled to a second gate line of the two gate lines. The source electrode of the first TFT may be electrically coupled to a first data line of the two data lines. And the source electrode of the second TFT may be electrically coupled to a second data line of the two data lines.

Preferably, the pixel unit may further comprise one gate line and two data lines. Gate electrodes of the first and second TFTs may be electrically coupled to the gate line. A source electrode of the first TFT may be electrically coupled to a first data line of the two data lines. The source electrode of the second TFT may be electrically coupled to a second data line of the two data lines.

Furthermore, the second pixel electrode may be a whole layer coated electrode; the first pixel electrode may be a strip-shaped electrode; and the first pixel electrode may be arranged on the second pixel electrode having an insulation layer sandwiched therebetween.

Furthermore, the drain electrode of the first TFT may be electrically coupled to the first pixel electrode via a via-hole. The drain electrode of the second TFT may be directly and electrically coupled to the second pixel electrode.

Preferably, the first pixel electrode and the second pixel electrode may be formed on a same layer. Both the first pixel electrode and the second pixel electrode may be strip-shaped electrodes.

Further, the first and second TFTs may have the same parameters.

Preferably, the first and second TFTs may have a same parasitic capacitor.

Preferably, the first pixel electrode, the second pixel electrode and the data lines may be formed on a same layer.

An array substrate may comprise a plurality of pixel units as described above arranged in form of matrix, for example.

Preferably, two pixel units that are in a same column and are in neighboring rows share one gate line.

A liquid crystal display (LCD) panel may comprise the array substrate as described above.

An LCD device may comprise the LCD panel as described above.

A driving method for a pixel unit is also provided. The pixel unit may comprise a first TFT, a second TFT, a first pixel electrode and a second pixel electrode. A drain electrode of the first TFT may be electrically coupled to the first pixel electrode. A drain electrode of the second TFT may be electrically coupled to the second pixel electrode. The first pixel electrode may be electrically insulated from the second pixel electrode. The driving method may comprise: providing a first voltage to the first pixel electrode; providing a second voltage to the second pixel electrode; generating an electrical field between the first pixel electrode and the second pixel electrode, when a voltage difference exists between the first voltage and the second voltage.

Preferably, the pixel unit may further comprise two gate lines and one data line. The step of providing the first voltage to the first pixel electrode of the pixel unit may specifically comprise: applying a turn-on voltage to a first gate line of the two gate lines that is electrically coupled to a gate electrode of the first TFT, so as to turn on the first TFT; applying the first voltage to the first pixel electrode by the data line that is electrically coupled to a source electrode of the first TFT. The step of providing the second voltage to the second pixel electrode of the pixel unit may specifically comprise: applying the turn-on voltage to a second gate line of the two gate lines that is electrically coupled to the gate electrode of the second TFT, so as to turn on the second TFT; applying the second voltage to the second pixel electrode by the data line that is electrically coupled to the source electrode of the second TFT.

Preferably, the pixel unit may further comprise two gate lines and two data lines. The step of providing the first voltage to the first pixel electrode of the pixel unit may specifically comprise: applying a turn-on voltage to a first gate line of the two gate lines that is electrically coupled to a gate electrode of the first TFT, so as to turn on the first TFT; applying the first voltage to the first pixel electrode by a first data line of the two data lines that is electrically coupled to a source electrode of the first TFT. The step of providing the second voltage to the second pixel electrode of the pixel unit may specifically comprise: applying the turn-on voltage to a second gate line of the two gate lines that is electrically coupled to the gate electrode of the second TFT, so as to turn on the second TFT; applying the second voltage to the second pixel electrode by a second data line of the two data lines that is electrically coupled to the source electrode of the second TFT.

Preferably, the pixel unit may further comprise one gate line and two data lines. The step of providing the first voltage to the first pixel electrode of the pixel unit and the step of providing the second voltage to the second pixel electrode of the pixel unit may be implemented simultaneously, which specifically comprises: applying a turn-on voltage to the gate line that is commonly and electrically coupled to the gate electrode of the first TFT and the gate electrode of the second TFT, so as to turn on the first and second TFTs simultaneously; applying the first voltage to the first pixel electrode by a first data line of the two data lines that is electrically coupled to a source electrode of the first TFT; meanwhile, applying the second voltage to the second pixel electrode by a second data line of the two data lines that is electrically coupled to the source electrode of the second TFT.

In the pixel unit, the array substrate, the LCD panel, the LCD device and driving method provided by the embodiments of the present invention, since two pixel electrodes are arranged in the pixel unit and each of the pixel electrodes is respectively controlled by a corresponding TFT, the rotation direction of the liquid crystal molecules may be controlled by the voltage difference between the two pixel electrodes, while the voltages on the pixel electrodes of other pixel units in the array substrate is not affected, so that the greenish phenomenon can be avoided. Furthermore, since the two TFTs for controlling the two pixel electrodes respectively may have same parasitic capacitor when the pixel unit is turned off, the voltage difference between the two pixel electrodes is kept unchanged, so that the occurrence of the image flickering phenomenon can be avoided.

BRIEF DESCRIPTION OF THE DRAWINGS

In the following, the figures associated with embodiments of the present invention will be briefly described for further clarifying the technical solutions in the embodiments.

DETAILED DESCRIPTION OF THE PREFERRED EMBODIMENTS

In the following, the technical solutions in the embodiments of the present invention will be clearly and fully described in conjunction with the figures in the embodiments of the present invention.

Figures 1, 2A:
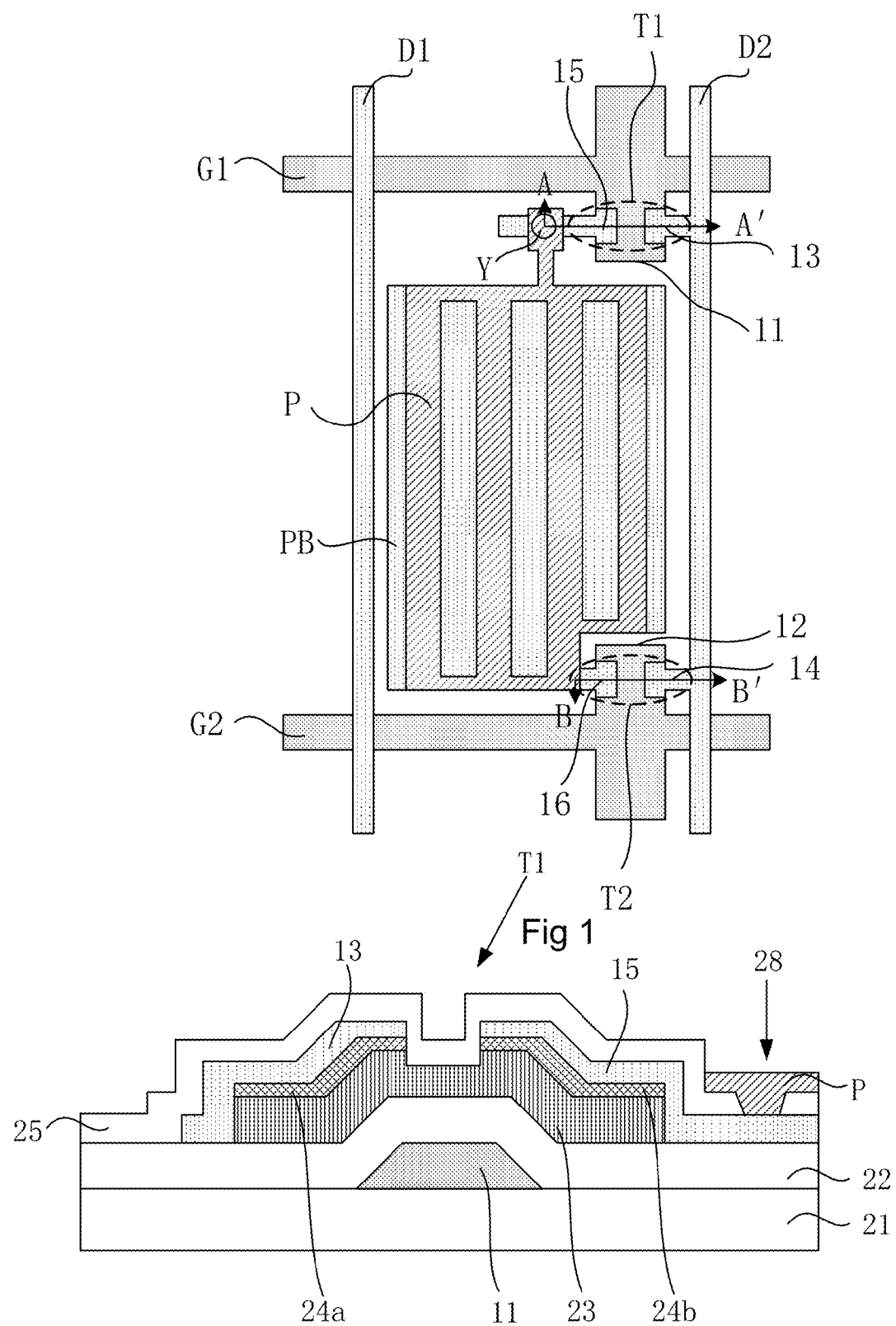
FIG. 1 is a top view of a kind of pixel unit according to an embodiment of the present invention.
FIG. 2a is a sectional view along A-A' of the pixel unit as illustrated in FIG. 1.

As illustrated in FIG. 1, an embodiment of the present invention provides a kind of pixel unit, comprising: a first TFT T1, a second TFT T2, a first pixel electrode P and a second pixel electrode PB; the drain electrode 15 of the first TFT T1 is electrically coupled to the first pixel electrode P; the drain electrode 16 of the second TFT T2 is electrically coupled to the second pixel electrode PB; and the first pixel electrode P is electrically insulated from the second pixel electrode PB, so that when a voltage difference exists between the first pixel electrode P and the second pixel electrode PB, an electrical field is generated between the first pixel electrode P and the second pixel electrode PB for controlling the rotation direction of liquid crystal molecules.

According to the embodiment of the present invention, the feature of the pixel unit lies in that: both electrodes for generating the electrical field are provided on an array substrate, and these two electrodes are insulated from each other. The pixel unit having such a structure is widely used in ADS (or AD-SDS, Advanced Super Dimension Switch) LCD panel and IPS (In-Plane Switching) LCD panel. The LCD device with the ADS/IPS LCD panel has a wider viewing angle.

Here, the ADS may form a multi-dimensional electric field from an electric field generated by a slit electrode edge on a same plane and an electric field generated between a slit electrode layer and a plate electrode layer, so that each of all oriented liquid crystal molecules between the slit electrodes in a liquid crystal cell and just over the electrodes may result in a rotation, and thus the operation efficiency of the liquid crystals is improved and the light transmission efficiency is increased. The ADS may improve the image quality of a TFT-LCD product, and have the advantages of high resolution, high transmittance, low power consumption, wide viewing angle, high aperture ratio, low chromatic aberration, push Mura free, and etc.

IPS may form a horizontal electrical field by a plurality of strip-shaped pixel electrodes and a plurality of strip-shaped common electrodes that are in parallel and arranged alternately. The electrical field direction of this horizontal electrical field is parallel to the substrate on which the pixel unit is formed, and this horizontal electrical field is configured for activating the rotation of the liquid crystal molecules in the pixel unit, so as to implement the image display.

The pixel unit according to the embodiment of the present invention is mainly different from the pixel unit in the conventional ADS/IPS LCD panel in comprising two TFTs that are configured for controlling two electrodes (pixel electrodes) respectively.

Since respective pixel units in conventional array substrate share a common electrode, the greenish phenomenon takes place due to the variation of the voltage of the common electrode which is caused by the capacitance coupling between the pixel electrode and the common electrode. In contrast, in the embodiments of the present invention, the pixel unit substitutes for the conventional common electrode by arranging two pixel electrodes which are insulated from each other. And these two pixel electrodes are controlled respectively by two TFTs in the pixel unit. Therefore, when the pixel unit is turned on, the rotation direction of the liquid crystal molecules are controlled by two electrodes (pixel electrodes) in the pixel unit which are independent from other pixel units, and the other pixel units are not affected at all. Therefore, the greenish phenomenon can be avoided.

Furthermore, the first and second TFTs may have exactly same parameters. Specifically speaking, the first and second TFTs may have the same parasitic capacitor. Here, the parasitic capacitor includes the parasitic capacitor between a gate electrode and a source electrode of the TFT, the parasitic capacitor between the gate electrode and a drain electrode of the TFT, or the parasitic capacitor between the source electrode and the drain electrode of the TFT. In the embodiments of the present invention, when the pixel unit is turned on, an electrical field is generated between the two pixel electrodes, and then the pixel unit is turned off, i.e. the TFTs for controlling the two pixel electrodes respectively are turned off. At this point, since a parasitic capacitor exists in both TFTs, the voltages on both pixel electrodes will drop simultaneously. And two parasitic capacitors between gate electrodes of the two TFTs and source electrodes or drain electrodes may become equivalent by controlling processing parameters. As a result, since the two parasitic capacitors are the same, the voltage drop capabilities of the two pixel electrodes are kept unchanged, so that the voltage difference between the two pixel electrodes is stable, and thus the occurrence of image flickering can be avoided.

Based on the above description, it is known that in the embodiments of the present invention, since two pixel electrodes are arranged and each of the pixel electrodes is respectively controlled by a corresponding TFT, the rotation direction of the liquid crystal molecules may be controlled by the voltage difference between the two pixel electrodes, while the voltage on the pixel electrodes of other pixel units in the array substrate is not affected, so that the greenish phenomenon can be avoided. Furthermore, since the two TFTs for controlling the two pixel electrodes respectively may have same electricity leakage capability when the pixel unit is turned off, the voltage difference between the two pixel electrodes is kept unchanged, and thus the occurrence of the image flickering can be avoided.

The pixel unit may further comprise a gate line and a data line. The gate line is coupled to the gate electrode of the TFT, and is configured for supplying voltage to the gate electrode of the TFT, so as to turn on the TFT. The data line is coupled to the source electrode of the TFT, and is configured for supplying voltage to the pixel electrode being coupled to the drain electrode of the TFT. A storage capacitance (not shown) is also arranged in the above pixel unit, and is configured for maintaining the voltages of the first pixel electrode and the second pixel electrode. The storage capacitance may be generated between the pixel electrode and the common line, or may be generated between the pixel electrode and the gate line.

Figure 6A:
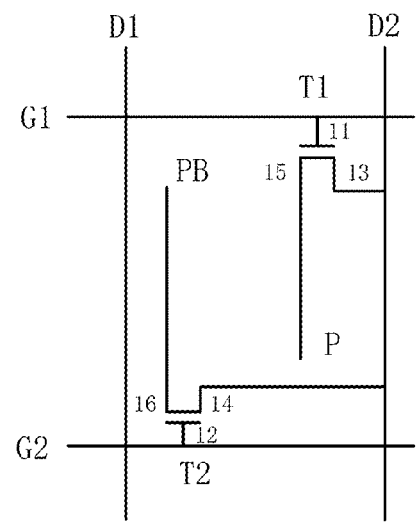
FIGS. 6a-6c each illustrates simplified schematic diagrams of three connection modes between a gate line and a data line in the pixel unit and the TFT according to an embodiment of the present invention.
Figure 6B:
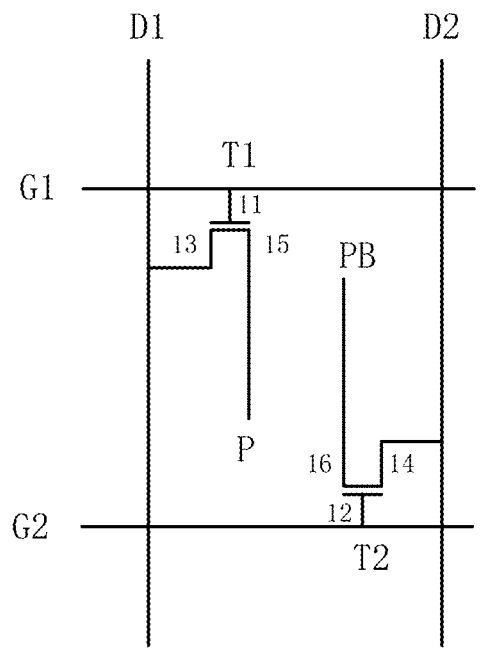
Figure 6C:
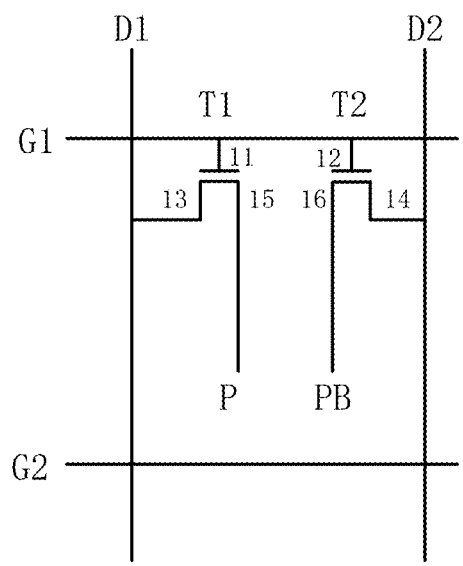

FIGS. 6a-6c each illustrates three connection modes of the gate line and the data line and the TFT, and the same components in FIGS. 6a-6c may have same reference signs.

The connection mode in FIG. 6a is same as the connection mode of the gate line and the data line and the TFT shown in FIG. 1, FIG. 6a is a simplified illustration of FIG. 1, and the same components in FIGS. 1 and 6a may have same reference signs. As illustrated in FIGS. 1 and 6a, the pixel unit may comprise two gate lines G1, G2 and one data line D2. A gate electrode 11 of a first TFT T1 is electrically coupled to the first gate line G1 of the two gate lines; a gate electrode 12 of a second TFT T2 is electrically coupled to the second gate line G2 of the two gate lines; and a source electrode 13 of the first TFT T1 and a source electrode 14 of the second TFT T2 are electrically coupled to the data line D2.

As illustrated in FIG. 6b, the pixel unit comprises two gate lines G1, G2 and two data lines D1, D2; a gate electrode 11 of a first TFT T1 is electrically coupled to a first gate line G1 of the two gate lines; a gate electrode 12 of a second TFT T2 is electrically coupled to a second gate line G2 of the two gate lines; a source electrode 13 of the first TFT T1 is electrically coupled to a first data line D1 of the two data lines; and a source electrode 14 of the second TFT T2 is electrically coupled to a second data line D2 of the two data lines.

As illustrated in FIG. 6c, the pixel unit may comprise one gate line G1 and two data lines D1, D2; a gate electrode 11 of a first TFT T1 and a gate electrode 12 of a second TFT T2 are electrically coupled to the gate line G1; a source electrode 13 of the first TFT T1 is electrically coupled to a first data line D1 of the two data lines; a source electrode 14 of the second TFT T2 is electrically coupled to a second data line D2 of the two data lines.

The pixel unit as illustrated in FIG. 1 is a pixel unit in ADS display panel, wherein a second pixel electrode PB is a whole layer coated electrode (which may be regarded as a plate electrode), a first pixel electrode P is a strip-shaped electrode (which may be regarded as a slit electrode), the first pixel electrode P is arranged on the second pixel electrode PB, there is an insulation layer (not shown) sandwiching between the first pixel electrode P and the second pixel electrode PB. It should be noted that the shapes of the first pixel electrode P and the second pixel electrode PB, and the relative position relations of the first pixel electrode P and the second pixel electrode PB are not limited to the illustration of FIG. 1, and may be other implementations that may achieve the formation of the multi-dimensional electrical field between the first pixel electrode P and the second pixel electrode PB.

In the pixel unit as illustrated in FIG. 1, it is preferred that the two TFTs T1, T2 are formed simultaneously, and the second pixel electrode PB and the data line D2 are formed on a same layer, so that a drain electrode of the second TFT T2 is directly and electrically coupled to the second pixel electrode PB. Since the first pixel electrode P covers the second pixel electrode PB using the insulation layer, a drain electrode of the first TFT T1 is electrically coupled to the first pixel electrode P via a via-hole Y, as illustrated in FIGS. 2a-2b.

FIG. 2a is a sectional schematic diagram of the first TFT T1 along A-A' of FIG. 1, and comprises the substrate 21, the gate electrode 11, the gate insulation layer 22, the semiconductor layer 23, the source electrode/drain electrode contact layer 24 from bottom to top in order. The gate electrode 11 of the first TFT is electrically coupled to the gate line G1. The source electrode 13 of the first TFT covers the source electrode contact layer 24a, and is electrically coupled to the data line D2. The drain electrode 15 of the first TFT covers the drain electrode contact layer 24b. The insulation layer 25 is covered on top of the drain electrode 15, the source electrode 13, and the partially exposed semiconductor layer 23. A via-hole 28 is arranged on the insulation layer 25. The first pixel electrode P being formed on the insulation layer is electrically coupled to the drain electrode 15 via the via-hole 28.

Figure 2B:
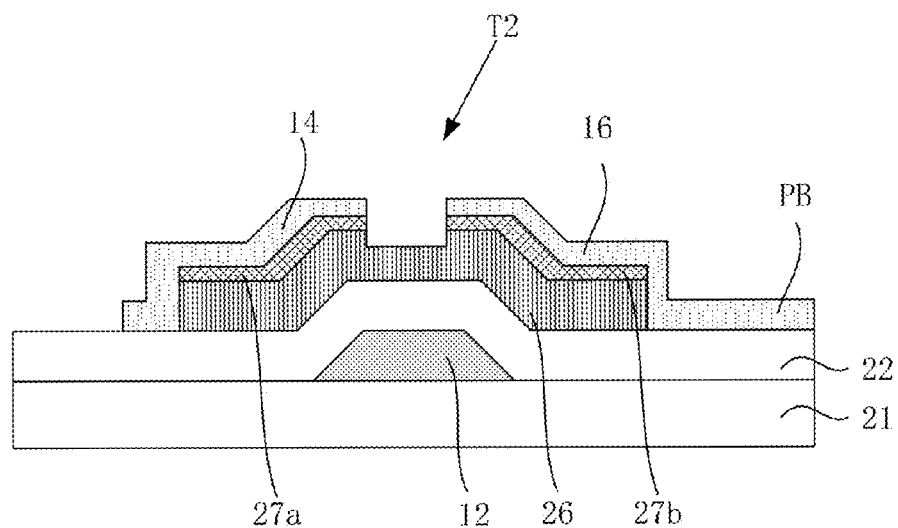
FIG. 2b is a sectional view along B-B' of the pixel unit as illustrated in FIG. 1.

FIG. 2b is a sectional schematic diagram of the second TFT T2 along B-B' of FIG. 1, and comprises the substrate 21, the gate electrode 12, the gate insulation layer 22, the semiconductor layer 26, the source electrode/drain electrode contact layer 27 from bottom to top in order. The gate electrode 12 of the second TFT is electrically coupled to the gate line G2. The source electrode 14 of the second TFT T2 covers the source electrode contact layer 27a, and is electrically coupled to the data line D2. The drain electrode 16 of the second TFT T2 covers the drain electrode contact layer 27b, and an extension part of the drain electrode 16 is being used as the second pixel electrode PB.

The same components in FIGS. 1, 2a and 2b have same reference signs.

The structures as illustrated in FIGS. 2a and 2b are preferred structures under a condition of simplified processing, i.e. the two TFTs are formed simultaneously, so as to reduce the process of forming the pixel unit. It should be noted that the two TFTs may also not be formed simultaneously, and the two TFTs are not limited to the bottom gate structure. Alternatively, one of the two TFTs may be of the bottom gate structure, and the other TFT may be of the top gate structure; or both TFTs are of the top gate structure. As a result, the electrical connection between the pixel electrode and the drain electrode of the TFT is not limited to the connection as illustrated in FIGS. 2a and 2b. The specific connection may be determined based on the structure of the TFT and the relative position relation between the pixel electrode and the TFT. For example, when the pixel electrode is above or below the drain electrode of the TFT, i.e. the pixel electrode is not formed in a same layer as the drain electrode of the TFT, the pixel electrode is electrically coupled to the drain electrode of the TFT by the via hole; when the pixel electrode is formed in a same layer as the drain electrode of the TFT, the pixel electrode is directly and electrically coupled to the drain electrode of the TFT, or the pixel electrode extends for forming the drain electrode of the TFT, or the drain electrode of the TFT extends for forming the pixel electrode.

Figure 3:
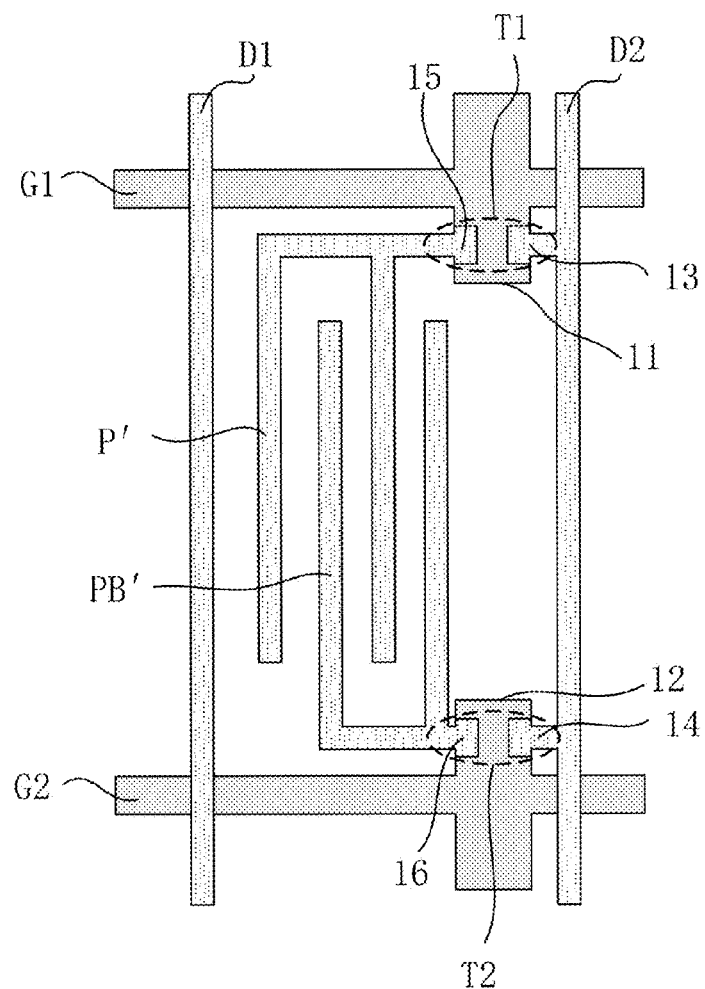
FIG. 3 is a top view of another kind of pixel unit according to an embodiment of the present invention.

The pixel unit as illustrated in FIG. 3 is a pixel unit in the IPS display panel, which is different from the pixel unit as illustrated in FIG. 1 in term of the structure and the position of the two pixel electrodes. As illustrated in FIG. 3, a first pixel electrode P' and a second pixel electrode PB' are formed on a same layer, and both of the first pixel electrode P' and the second pixel electrode PB' are strip-shaped electrodes. In addition, as shown in FIG. 3, the first pixel electrode P' and the second pixel electrode PB' are arranged alternately.

The same components in FIGS. 1 and 3 have same reference signs.

In the pixel unit as illustrated in FIG. 3, it is preferred that the two TFTs T1, T2 are formed simultaneously, and the first pixel electrode P', the second pixel electrode PB' and the data lines D1, D2 are formed on a same layer, so that the drain electrode 15 of the first TFT T1 is directly and electrically coupled to the first pixel electrode P', and the drain electrode 16 of the second TFT T2 is directly and electrically coupled to the second pixel electrode PB'.

As mentioned above, the two TFTs shown in FIG. 3 are formed simultaneously, so as to reduce the processes for forming the pixel unit. It should be noted that the two TFTs may also not be formed simultaneously. Moreover, one of the two TFTs may be of the bottom gate structure, and the other TFT may be of the top gate structure; or both TFTs are of the top gate structure; or both TFTs are of the bottom gate structure. As a result, the electrical connection between the pixel electrode and the drain electrode of the TFT is not limited to the direct electrical connection as described above. The specific connection may be determined based on the structure of the TFT and the relative position relation between the pixel electrode and the TFT.

It should be noted that both FIG. 1 and FIG. 3 are only schematic diagram of the pixel unit. The first pixel electrode P as illustrated in FIG. 1 comprises three slits in the vertical direction; and the first pixel electrode P' and the second pixel electrode PB' as illustrated in FIG. 3 only comprise two branches. As known by those skilled in the art, the shape of the two pixel electrodes may be any shape that may cause the generation of a multi-dimensional electrical field or horizontal field being parallel to the surface of the pixel unit between the two pixel electrodes, and may cause the electrical insulation between the two pixel electrodes.

Figure 4:
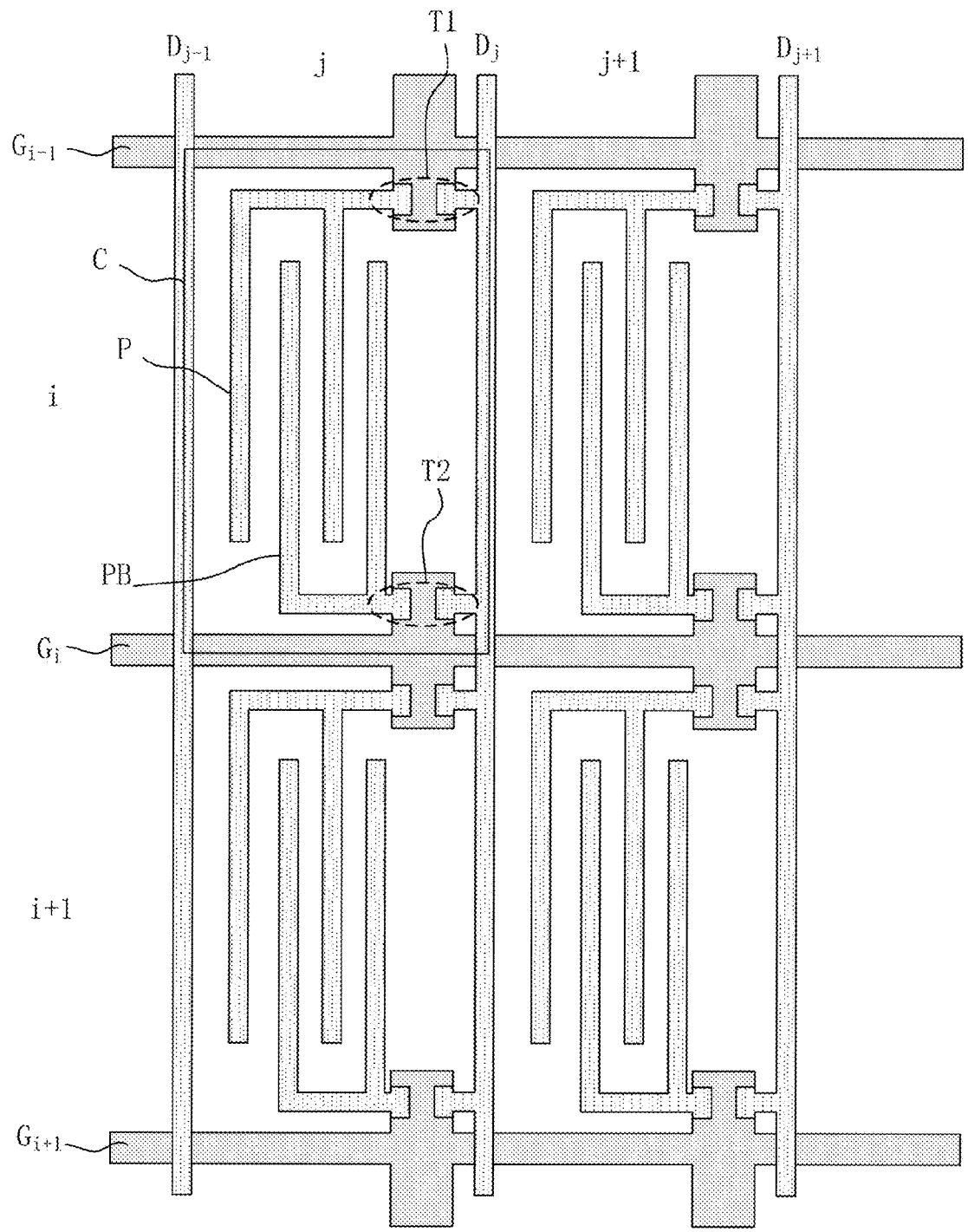
FIG. 4 is a partial top view of a kind of array substrate according to an embodiment of the present invention.

The embodiments of the present invention also provide an array substrate, which includes a plurality of the above pixel units that may be arranged in form of matrix. FIG. 4 illustrates four pixel units C that are neighboring in the array substrate. The structures of these four pixel units C are same as the structure of the pixel unit as illustrated in FIG. 3. Here, one pixel unit C may share a gate line with a pixel unit in the same column and neighboring row. And of course, the present invention is not limited thereto. It may be seen from FIG. 4 that a gate line $G_i$ is arranged at the intersection by two neighboring pixel units C in the same column, and the gate electrodes of the TFTs that are respectively in the two neighboring pixel units C and are near the gate line $G_i$ are coupled to the gate line G. Here, i indicates the sequence number of the gate line, and $G_i$ indicates the $i^{th}$ gate line. It is assumed that the array substrate has pixel units in n rows and m columns, and then the number of the gate lines of the array substrate is n+1. The character j in FIG. 4 indicates the sequence number of the pixel unit, i.e. the pixel units in the column that correspond to the character j are the pixel units in the $j^{th}$ column. The source electrodes of the TFTs in the pixel units in the $j^{th}$ column are coupled to the data line $D_j$. Similarly, the source electrodes of the TFTs in the pixel units in the $j-1^{th}$ column are coupled to the data line $D_{j-1}$, and the source electrodes of the TFTs in the pixel units in the $j+1^{th}$ column are coupled to the data line $D_{j+1}$.

The array substrate as illustrated in FIG. 4 adopts the structure of the pixel units as illustrated in FIG. 3. Naturally it may also adopt other structures of the pixel units which are applicable to the present invention and known by those skilled in the art.

In the array substrate provided by the embodiments of the present invention, since it is adopted that the bipolar pixel unit with two pixel electrodes respectively controlled by independent TFTs provided by the above embodiment of the present invention, the occurrence of greenish phenomenon and image flickering in prior art can be avoided.

The embodiments of the present invention also provide an LCD device comprising the array substrate. The LCD device may be a LCD panel, a mobile phone, a computer or a TV set. Since the bipolar pixel unit with two pixel electrodes respectively controlled by independent TFTs provided by the above embodiments are adopted in the LCD device, the occurrence of greenish phenomenon and image flickering in prior art can be avoided.

The embodiments of the present invention also provide a driving method for the array substrate, the array substrate comprises a plurality of pixel units arranged in form of matrix. As illustrated in FIG. 1, each pixel unit may comprise a first TFT T1, a second TFT T2, a first pixel electrode P and a second pixel electrode PB. The drain electrode of the first TFT T1 is electrically coupled to the first pixel electrode P; the drain electrode of the second TFT T2 is electrically coupled to the second pixel electrode PB; and the first pixel electrode is electrically insulated from the second pixel electrode. The driving method may comprise: providing a first voltage to the first pixel electrode P; providing a second voltage to the second pixel electrode PB; when a voltage difference exists between the first voltage and the second voltage, an electrical field is generated between the first pixel electrode and the second pixel electrode.

In the driving method for the pixel unit provided by the embodiment of the present invention, the conventional common electrode is replaced by arranging two pixel electrodes which are insulated from each other in the pixel unit, and these two pixel electrodes are controlled respectively by two TFTs in the pixel unit. Therefore, when the pixel unit is turned on, the voltages are respectively applied to two electrodes (pixel electrodes) which are independent from other pixel units by two TFTs to control the rotation of the liquid crystal molecules, and the other pixel units are not affected at all. As a result, the occurrence of the greenish phenomenon can be avoided.

Furthermore, when the pixel unit is turned on, an electrical field is generated between the two pixel electrodes. Subsequently, the pixel unit is turned off, i.e. the TFTs for controlling the two pixel electrodes respectively are turned off. At this point, since a drain electrode current exists in both TFTs, the voltages on both pixel electrodes will drop simultaneously and the electricity leakage capabilities of the two TFTs may be same by controlling processing parameters. As a result, the voltage drop capabilities of the two pixel electrodes are kept unchanged, so that the voltage difference between the two pixel electrodes is stable. Therefore, the occurrence of image flickering can be avoided.

Based on the above description, in the driving method for the pixel unit provided by the embodiment of the present invention, since two pixel electrodes are arranged in the pixel unit and each of the pixel electrodes is respectively controlled by a corresponding TFT, the rotation direction of the liquid crystal molecules may be controlled by the voltage difference between the two pixel electrodes, while the voltage on the pixel electrodes of other pixel units in the array substrate is not affected, so that the greenish phenomenon can be avoided. Furthermore, since the two TFTs for controlling the two pixel electrodes respectively may have same electricity leakage capability when the pixel unit is turned off, the voltage difference between the two pixel electrodes is kept unchanged, and thus the occurrence of the image flickering can be avoided.

In the above embodiments, three connection modes of the connection between the gate line and the data line and the TFT in the pixel unit are shown by FIG. 6a to FIG. 6c, respectively. Accordingly, the pixel unit in different connection mode is to be driven by different driving method. In the following, the driving methods of the pixel unit shown in FIG. 6a to FIG. 6c will be respectively described.

As illustrated in FIG. 6a, the pixel unit comprises two gate lines G1, G2 and one data line D1. In the driving method for the pixel unit, the step of providing a first voltage to a first pixel electrode P specifically comprises: applying a turn-on voltage to the first gate line G1 of the two gate lines which is electrically coupled to a gate electrode 11 of a first TFT T1, so as to turn on the first TFT T1; applying the first voltage to the first pixel electrode P by the data line D2 which is electrically coupled to the source electrode 13 of the first TFT T1.

In the above driving method of the pixel unit, the step of providing a second voltage to a second pixel electrode PB specifically comprises: applying a turn-on voltage to the second gate line G2 of the two gate lines which is electrically coupled to the gate electrode 12 of a second TFT T2, so as to turn on the second TFT T2; applying the second voltage to the second pixel electrode PB by the data line D2 which is electrically coupled to the source electrode 14 of the second TFT T2.

As illustrated in FIG. 6b, the pixel unit comprises two gate lines G1, G2 and two data lines D1, D2. In the above driving method for the pixel unit, the step of providing the first voltage to the first pixel electrode P specifically comprises: applying a turn-on voltage to the first gate line G1 of the two gate lines which is electrically coupled to the gate electrode 11 of the first TFT T1, so as to turn on the first TFT T1; applying the first voltage to the first pixel electrode P by the first data line D1 of the two data lines which is electrically coupled to the source electrode 13 of the first TFT T1.

In the above driving method for the pixel unit, the step of providing the second voltage to the second pixel electrode PB specifically comprises: applying a turn-on voltage to the second gate line G2 of the two gate lines which is electrically coupled to the gate electrode 12 of the second TFT T2, so as to turn on the second TFT T2; applying the second voltage to the second pixel electrode PB by the second data line D2 of the two data lines which is electrically coupled to the source electrode 14 of the second TFT T2.

As illustrated in FIG. 6c, the pixel unit comprises a gate line G1 and two data lines D1, D2. In the above driving method for the pixel unit, the step of providing the first voltage to the first pixel electrode P and the step of providing the second voltage to the second pixel electrode may be implemented simultaneously, which specifically comprise: applying a turn-on voltage to the gate line G1 which is commonly and electrically coupled to the gate electrode 11 of the first TFT T1 and the gate electrode 12 of the second TFT T2, so as to turn on the first TFT T1 and the second TFT T2 simultaneously; applying the first voltage to the first pixel electrode P by the first data line D1 of the two data lines which is electrically coupled to the source electrode 13 of the first TFT T1; meanwhile, applying the second voltage to the second pixel electrode PB by the second data line D2 of the two data lines which is electrically coupled to the source electrode 14 of the second TFT T2.

In the following, a specific embodiment of the driving method for the array substrate will be described in conjunction with FIG. 4 and FIG. 5 for further clarifying how each pixel unit in the array substrate is driven.

This method is configured for driving the array substrate as illustrated in FIG. 4 and adopts the line scanning manner, i.e. applying a voltage to the gate line row by row.

Figure 5:
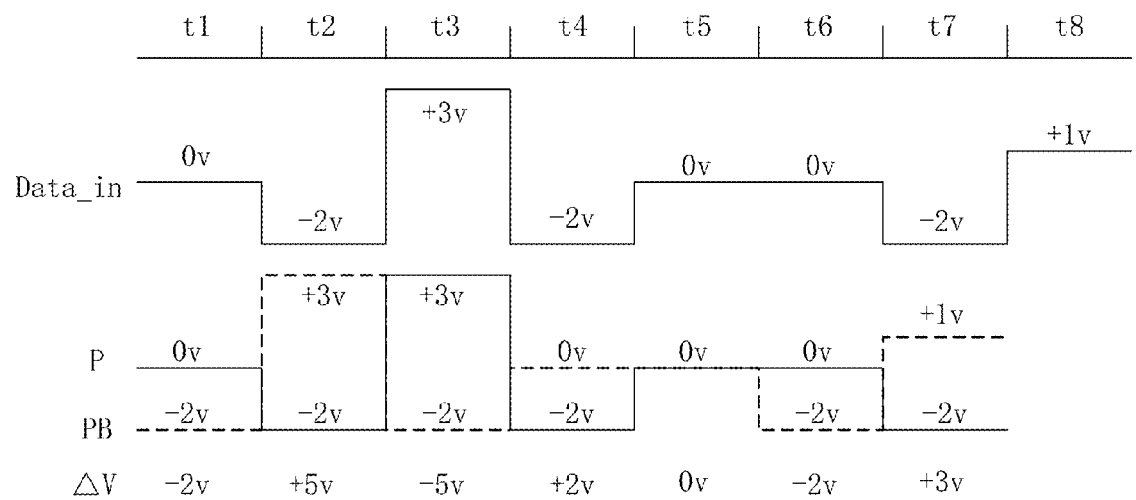
FIG. 5 illustrates a voltage waveform of a driving method for the array substrate according to an embodiment of the present invention.

Specifically, it is assumed that during the time of displaying a frame of image, the data voltage Data_in as illustrated in FIG. 5 is applied to the data line $D_j$ of the pixel units in the $j^{th}$ column in the array substrate as illustrated in FIG. 4. It can be seen from the waveform diagram that, in the predetermined time intervals t1~t8, the following voltages are applied on the data line in turn: 0 v, −2 v, +3 v, −2 v, 0 v, 0 v, −2 v, 1 v. Meanwhile, during the time of displaying the frame of image, the turn-on voltage is applied on the $i-1^{th}$ gate line to the $i+6^{th}$ gate line in turn in the predetermined time intervals t1~t8. In other words, during the first time interval t1, the turn-on voltage is applied on the $i-1^{th}$ gate line $G_{i-1}$, the first TFT of the pixel unit in the $i^{th}$ row is turned on, the voltage of 0 v is applied on the first pixel electrode P being coupled to the first TFT T1 in the pixel unit C in the $i^{th}$ row and the $j^{th}$ column; during the second time interval t2, the gate line $G_{i-1}$ in the row is turned off, i.e. the first TFT T1 of the pixel unit in the $i-1^{th}$ row is turned off, and under the storage capacitance, the voltage on the first pixel electrode P may be maintained until the display of the frame of image is completed, the turn-on voltage is applied on the $i^{th}$ gate line $G_i$, the second TFT T2 of the pixel unit in the $i^{th}$ row and the first TFT T1 of the pixel unit in the $i+1^{th}$ row are turned on, the voltage of −2 v is applied on the second pixel electrode PB being coupled to the second TFT T2 in the pixel unit C in the $i^{th}$ row and the $j^{th}$ column, meanwhile the voltage of −2 v is also applied on the first pixel electrode being coupled to the first TFT T1 in the pixel unit in the $i+1^{th}$ row and the $j^{th}$ column, so that a voltage difference of (−2−0)v (i.e. −2 v) is generated between the first pixel electrode P and the second pixel electrode PB in the pixel unit in the $i^{th}$ row and the $j^{th}$ column, and a horizontal electrical field is generated to drive the pixel unit for displaying. Similarly, when the $i^{th}$ gate line $G_i$ is turned off and the $i+1^{th}$ gate line $G_{i+1}$ is turned on, the voltage of the second pixel electrode in the pixel unit C in the $i^{th}$ row and the $j^{th}$ column may also be maintained until the display of the frame of the image is completed by the storage capacitance, and so on. The waveform in solid line indicated by P in FIG. 5 illustrates the voltage being applied on the first pixel electrode P in pixel unit in each row in turn; the waveform in dotted line indicated by PB illustrates the voltage being applied on the second pixel electrode PB in each pixel unit in turn. Therefore, a voltage difference ΔV is obtained by subtracting the voltage on the first pixel electrode P from the voltage on the second pixel electrode PB, and such voltage difference is a voltage being configured for controlling the rotation direction of the liquid crystal molecules in the pixel unit.

By adopting such a driving method, the absolute value of the voltage being applied on a single pixel electrode is significantly reduced while the same control voltage of the liquid crystal molecules may be obtained. For example, as illustrated in FIG. 5, the voltage difference between the two pixel electrodes being obtained during the time interval t2 is +5 v, and the voltages being required to be applied on the two pixel electrodes are −2 v and +3 v respectively. If the structure of the pixel unit with a pixel electrode and a common electrode in prior art is driven, the voltage on the common electrode is generally set to 0 v, and a voltage of +5 v is required to be applied on the pixel electrode for obtaining the voltage difference of +5 v between the pixel electrode and the common electrode.

The above descriptions are only specific embodiments of the present invention, while the protection scope of the present invention is not limited thereto. Any modification or substitution that is obvious for those skilled in the art in the technical field disclosed by the present invention is fallen into the protection scope of the present invention. Thus, the protection scope of the present invention is confined by the protection scope of the claims.

What is claimed is:

1. An array substrate, comprising a plurality of pixel units arranged in form of matrix, each pixel unit comprising: a first thin film transistor (TFT), a second TFT, a first pixel electrode and a second pixel electrode;
   wherein a drain electrode of the first TFT is electrically coupled to the first pixel electrode; a drain electrode of the second TFT is electrically coupled to the second pixel electrode; and the first pixel electrode is electrically insulated from the second pixel electrode, so that when an electric potential difference exists between the first pixel electrode and the second pixel electrode, an electric field is generated between the first pixel electrode and the second pixel electrode;
   wherein the second pixel electrode is a whole layer coated electrode; the first pixel electrode is a strip-shaped electrode; and the first pixel electrode is arranged on the second pixel electrode having an insulation layer sandwiched therebetween;
   the second pixel electrode directly extends from the drain electrode of the second TFT.

2. The array substrate according to claim 1, wherein the pixel unit further comprises two gate lines and one data line; and
   a gate electrode of the first TFT is electrically coupled to a first gate line of the two gate lines; a gate electrode of the second TFT is electrically coupled to a second gate line of the two gate lines; and source electrodes of the first and second TFTs are electrically coupled to the data line.

3. The array substrate according to claim 1, wherein each pixel unit further comprises two gate lines and two data lines; and
   a gate electrode of the first TFT is electrically coupled to a first gate line of the two gate lines; a gate electrode of the second TFT is electrically coupled to a second gate line of the two gate lines; a source electrode of the first TFT is electrically coupled to a first data line of the two data lines; and a source electrode of the second TFT is electrically coupled to a second data line of the two data lines.

4. The array substrate according to claim 1, wherein each pixel unit further comprises one gate line and two data lines; and
   gate electrodes of the first and second TFTs are electrically coupled to the gate line; a source electrode of the first TFT is electrically coupled to a first data line of the two data lines; and a source electrode of the second TFT is electrically coupled to a second data line of the two data lines.

5. The array substrate according to claim 1, wherein the drain electrode of the first TFT is electrically coupled to the first pixel electrode via a via-hole; and the drain electrode of the second TFT is electrically coupled to the second pixel electrode.

6. The array substrate according to claim 1, wherein the first and second TFTs have same parameters.

7. The array substrate according to claim 6, wherein the first and second TFTs have a same parasitic capacitor.

8. The array substrate according to claim 6, wherein the first TFT has a first parasitic capacitor between a gate electrode of the first TFT and the drain electrode of the first TFT;
the second TFT has a second parasitic capacitor between a gate electrode of the second TFT and the drain electrode of the second TFT;
the first parasitic capacitor is equal to the second parasitic capacitor.

9. The array substrate according to claim 1, wherein two pixel units that are in a same column and are in neighboring rows are controlled by one gate line.

10. A liquid crystal display (LCD) device, comprising the array substrate according to claim 1.

11. A method for driving an array substrate, wherein the array substrate comprises a plurality of pixel units arranged in form of matrix, each pixel unit comprises a first TFT, a second TFT, a first pixel electrode and a second pixel electrode; a drain electrode of the first TFT is electrically coupled to the first pixel electrode; a drain electrode of the second TFT is electrically coupled to the second pixel electrode; and the first pixel electrode is electrically insulated from the second pixel electrode, wherein the second pixel electrode is a whole layer coated electrode; the first pixel electrode is a strip-shaped electrode; and the first pixel electrode is arranged on the second pixel electrode having an insulation layer sandwiched therebetween; the second pixel electrode directly extends from the drain electrode of the second TFT; the method comprising:
providing a first voltage to the first pixel electrode;
providing a second voltage to the second pixel electrode; and
generating an electric field between the first pixel electrode and the second pixel electrode, when a voltage difference exists between the first voltage and the second voltage.

12. The method according to claim 11, wherein each pixel unit further comprises two gate lines and one data line,
the step of providing the first voltage to the first pixel electrode of the pixel unit comprises:
applying a turn-on voltage to a first gate line of the two gate lines that is electrically coupled to a gate electrode of the first TFT, so as to turn on the first TFT; and
applying the first voltage to the first pixel electrode by the data line that is electrically coupled to a source electrode of the first TFT;
the step of providing the second voltage to the second pixel electrode of the pixel unit comprises:
applying the turn-on voltage to a second gate line of the two gate lines that is electrically coupled to a gate electrode of the second TFT, so as to turn on the second TFT; and
applying the second voltage to the second pixel electrode by the data line that is electrically coupled to a source electrode of the second TFT.

13. The method according to claim 11, wherein each pixel unit further comprises two gate lines and two data lines,
the step of providing the first voltage to the first pixel electrode of the pixel unit comprises:
applying a turn-on voltage to a first gate line of the two gate lines that is electrically coupled to a gate electrode of the first TFT, so as to turn on the first TFT; and
applying the first voltage to the first pixel electrode by a first data line of the two data lines that is electrically coupled to a source electrode of the first TFT;
the step of providing the second voltage to the second pixel electrode of the pixel unit comprises:
applying the turn-on voltage to a second gate line of the two gate lines that is electrically coupled to a gate electrode of the second TFT, so as to turn on the second TFT; and
applying the second voltage to the second pixel electrode by a second data line of the two data lines that is electrically coupled to a source electrode of the second TFT.

14. The method according to claim 11, wherein each pixel unit further comprises one gate line and two data lines,
the step of providing the first voltage to the first pixel electrode of the pixel unit and the step of providing the second voltage to the second pixel electrode of the pixel unit are implemented simultaneously, which comprises:
applying a turn-on voltage to the gate line that is commonly and electrically coupled to gate electrodes of the first and second TFTs, so as to turn on the first and second TFTs simultaneously; and
applying the first voltage to the first pixel electrode by a first data line of the two data lines that is electrically coupled to a source electrode of the first TFT; meanwhile, applying the second voltage to the second pixel electrode by a second data line of the two data lines that is electrically coupled to a source electrode of the second TFT.

15. The method according to claim 11, wherein the first TFT has a first parasitic capacitor between a gate electrode of the first TFT and the drain electrode of the first TFT;
the second TFT has a second parasitic capacitor between a gate electrode of the second TFT and the drain electrode of the second TFT;
the first parasitic capacitor is equal to the second parasitic capacitor.

16. An array substrate, comprising a plurality of pixel units arranged in form of matrix, each pixel unit comprising: a first thin film transistor (TFT), a second TFT, a first pixel electrode and a second pixel electrode;
wherein a drain electrode of the first TFT is electrically coupled to the first pixel electrode; a drain electrode of the second TFT is electrically coupled to the second pixel electrode; and the first pixel electrode is electrically insulated from the second pixel electrode, so that when an electric potential difference exists between the first pixel electrode and the second pixel electrode, an electric field is generated between the first pixel electrode and the second pixel electrode;
wherein the pixel unit further comprises two gate lines and one data line; and
a gate electrode of the first TFT is electrically coupled to a first gate line of the two gate lines; a gate electrode of the second TFT is electrically coupled to a second gate line of the two gate lines; and source electrodes of the first and second TFTs are electrically coupled to the data line;
wherein the second pixel electrode directly extends from the drain electrode of the second TFT.

17. The array substrate according to claim 16, wherein the first pixel electrode and the second pixel electrode are strip-shaped electrodes.

18. The array substrate according to claim 17, wherein the first pixel electrode and the second pixel electrode are formed on a same layer.

19. The array substrate according to claim 16, wherein the first TFT has a first parasitic capacitor between the gate electrode of the first TFT and the drain electrode of the first TFT;

the second TFT has a second parasitic capacitor between the gate electrode of the second TFT and the drain electrode of the second TFT;

the first parasitic capacitor is equal to the second parasitic capacitor.

* * * * *